(12) United States Patent
Barton

(10) Patent No.: US 8,881,415 B2
(45) Date of Patent: Nov. 11, 2014

(54) SOLAR SYSTEM ALIGNMENT TOOL AND METHOD

(71) Applicant: SunPower Corporation, San Jose, CA (US)

(72) Inventor: Nicholas Barton, Richmond, CA (US)

(73) Assignee: SunPower Corporation, San Jose, CA (US)

( * ) Notice: Subject to any disclaimer, the term of this patent is extended or adjusted under 35 U.S.C. 154(b) by 225 days.

(21) Appl. No.: 13/631,775

(22) Filed: Sep. 28, 2012

(65) Prior Publication Data

US 2014/0090263 A1    Apr. 3, 2014

(51) Int. Cl.
| | |
|---|---|
| *G01B 5/25* | (2006.01) |
| *G01B 5/14* | (2006.01) |
| *F24J 2/00* | (2014.01) |
| *H01L 31/042* | (2014.01) |
| *H01L 31/052* | (2014.01) |

(52) U.S. Cl.
CPC .. *G01B 5/14* (2013.01); *G01B 5/25* (2013.01); *F24J 2/00* (2013.01); *H01L 31/0422* (2013.01); *H01L 31/0525* (2013.01)
USPC ............................................. 33/412; 33/645

(58) Field of Classification Search
CPC ........................................................ G01B 5/25
USPC .................................. 33/412, 529, 613, 645
See application file for complete search history.

(56) References Cited

U.S. PATENT DOCUMENTS

| | | | | |
|---|---|---|---|---|
| 4,516,328 | A  * | 5/1985 | Massey | 33/645 |
| 4,586,264 | A  * | 5/1986 | Zatezalo | 33/412 |
| 4,964,224 | A  * | 10/1990 | Jackson | 33/645 |
| 5,371,953 | A  * | 12/1994 | Nower et al. | 33/645 |
| 7,111,407 | B2 * | 9/2006 | Jones | 33/412 |
| 7,478,483 | B2 * | 1/2009 | Wrzyszczynski | 33/412 |
| 7,968,791 | B2 | 6/2011 | Do et al. | |
| 2002/0133960 | A1 * | 9/2002 | Cross | 33/412 |
| 2002/0138995 | A1 * | 10/2002 | Dameron | 33/529 |
| 2003/0062037 | A1 | 4/2003 | Hayden et al. | |
| 2004/0221466 | A1 * | 11/2004 | Faubion | 33/645 |
| 2006/0044511 | A1 | 3/2006 | Mackamul | |
| 2007/0214670 | A1 * | 9/2007 | Wrzyszczynski | 33/412 |
| 2008/0314440 | A1 | 12/2008 | Clemens et al. | |

FOREIGN PATENT DOCUMENTS

WO    WO 2012-116102    8/2012

OTHER PUBLICATIONS

International Search Report and Written Opinion of the International Searching Authority in counterpart International Appl. No. PCT/US2012/070620, dated Jun. 27, 2013, in 11 pages.

* cited by examiner

*Primary Examiner* — Brad Bennett
(74) *Attorney, Agent, or Firm* — Knobbe, Martens, Olson & Bear LLP

(57) ABSTRACT

An alignment tool for aligning torque tubes of the solar collection system can include a rigid body member and two laterally extending alignment arms. Optionally, the alignment arms can include releasable clamps that can engage and disengage without the use of tools. The tool can be designed to straddle a sun-tracking drive of a sun-tracking solar system. Thus, the tool can be used both during initial construction as well as after construction is complete for alignment purposes.

20 Claims, 8 Drawing Sheets

SOLAR SYSTEM ALIGNMENT TOOL AND METHOD

TECHNICAL FIELD

Embodiments of the subject matter described herein relate generally to alignment tools and methods for solar energy systems which include serially connected rotating shafts supporting solar energy collecting devices.

BACKGROUND

Some larger solar collector installations include an array of sun-tracking, solar power collector assemblies. Such assemblies can be used in conjunction with photovoltaic modules, concentrated photovoltaic modules, as well as concentrated thermal solar collector devices.

Sun-tracking collector systems typically include hardware for automatically adjusting the position of the collector devices to track the sun as it moves across the sky. This tracking movement can be accomplished in a number of different ways. Some systems use a single axis tracking system in which the collector devices pivot about a single axis. Such single axis type tracking systems often include a drive shaft or "torque tube" which defines a single pivot axis. Additionally, some systems drive a plurality of torque tubes with one drive motor.

Concentrated photovoltaic solar systems can provide significant cost savings over non-concentrated photovoltaic systems. This is because concentrated photovoltaic systems only use a fraction of the amount of photovoltaic material to collect about the same amount of sunlight. However, sun-tracking accuracy becomes more important with concentrated systems. For example, it is known that efficiency of a solar collector can drop if the mirrors of a concentrated system are misaligned by as little as 0.1°. Thus, high performance of such systems is more likely to be achieved if the components of the concentrated systems are manufactured to precise tolerances. Additionally, such concentrated photovoltaic systems are more affordable, if the hardware and/or labor required to construct such a system is reduced.

BRIEF SUMMARY

An aspect of at least one of the inventions disclosed herein includes the realization that certain labor-intensive tasks that have previously been performed on the construction site of a photovoltaic system, can be performed more quickly, accurately, and/or with less cost if certain activities can be performed more easily and quickly. For example, one step of constructing a concentrated photovoltaic system is the rotational alignment with shafts that are serially connected and axially aligned with each other.

For example, some tracking photovoltaic systems include large numbers of photovoltaic modules supported on torque tubes, wherein there are a plurality of torque tubes connected end to end and are driven by a single drive motor. In this type of configuration, although the use of one drive motor to drive a plurality of torque tubes reduces the number of required drive units and thus costs, the alignment of the torque tubes with each other can present a significant challenge.

When attempting to rotationally align torque tubes that are connected in an end to end fashion, sophisticated equipment with high degrees of precision and accuracy are often used to ensure proper rotational alignment and registration between the torque tubes. Some solar power installation sites, however, are in remote areas that can be a difficult environment in which to perform high precision measurement activities.

An aspect of at least one of the inventions disclosed herein includes the realization that a removable alignment tool that can rigidly engage torque tubes, such as torque tubes that are connected to opposite sides of a sun-tracking drive unit, can significantly simplify the procedure of aligning the torque tubes.

Thus, in accordance with an embodiment, a method can be provided for aligning two shafts where each shaft has at least one alignment reference surface. The method can comprise pressing the alignment reference surface of a first shaft against a first reference surface of an alignment device, and pressing the alignment reference surface of a second shaft against a second reference surface of the alignment device wherein the first and second reference surfaces of the alignment device are spaced apart along the longitudinal direction of the shafts. The method can also include rotationally fixing the first shaft to the second shaft while the alignment device is pressed against the reference surfaces of the first and second shafts.

In accordance with another embodiment a method can be provided for connecting a first drive member of a first shaft to a second drive member of a second shaft, wherein the first and second shafts are approximately aligned along a longitudinal axis and wherein the first and second drive members are spaced from each other along a longitudinal axis of the shafts. The method can comprise a first step for securing a first portion of an alignment member to a first alignment reference portion of the first shaft and a second step for securing a second portion of the alignment member to a second alignment reference portion of the second shaft, wherein the first and second alignment reference portions are spaced apart from each other along the longitudinal axes of the first and second shafts. Additionally, the methods can include rotationally fixing the first drive member relative to the second drive member while the alignment member is secured to the first and second alignment reference portions.

In accordance with yet another embodiment an alignment device for aligning shafts along a longitudinal axis of the shafts can comprise a bridge member having a first end and a second end. A first reference surface can be disposed at the first end and a second reference surface disposed at the second end. A first engagement device can be disposed at the first end and configured to engage the first shaft having a first shaft reference surface and to press the first shaft reference surface against the first reference surface. Additionally, a second engagement device can be configured to engage a second shaft and to press a second shaft reference surface against the second reference surface, to thereby align first and second shafts with each other, the first and second engagement devices being spaced apart from each other along the longitudinal axes of the shafts.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
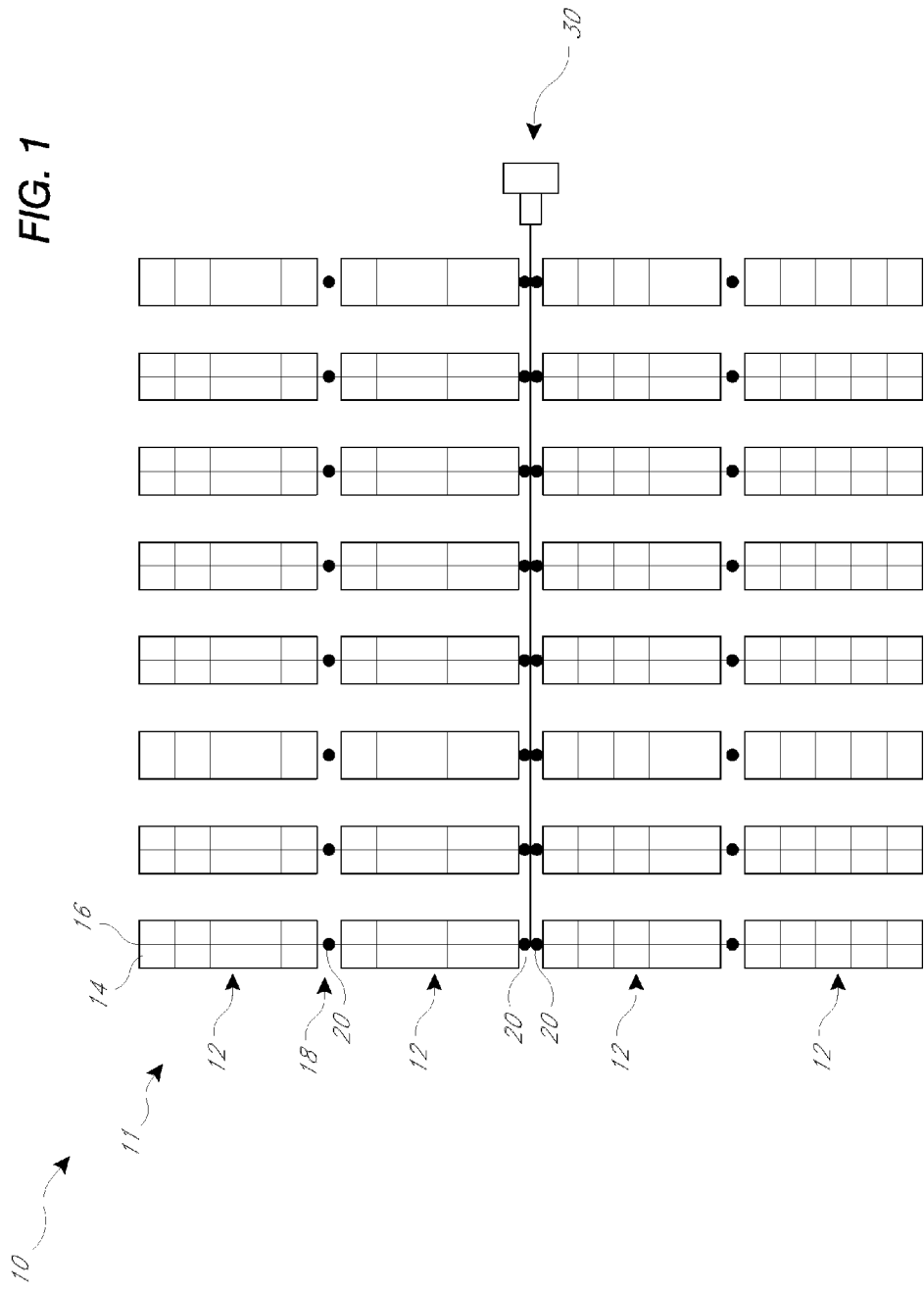
FIG. 1 is a schematic top plan view of a non-concentrated solar collector system including a sun-tracking with which the alignment tool and methods can be used.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the proceeding technical field, background, brief summary, or the following

DETAILED DESCRIPTION

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

The inventions disclosed herein are described in the context of non-concentrated and concentrated photovoltaic arrays and modules. However, these inventions can be used in other contexts as well, such as concentrated thermal solar systems, etc.

In the description set forth below, a solar energy collection system 10 is described in the context of being formed by a plurality of solar collection modules, supported so as to be pivotally adjustable for sun-tracking purposes. Each of the modules can include a support member supporting a plurality of solar collection devices as well as wiring for connecting the various solar collection devices to each other and to other modules. The present inventions directed to alignment tools and methods of alignment are described in greater detail below with reference to FIG. 7-8 in the context of use with the alignment of components of the system 10.

FIG. 1 illustrates a solar collection system 10, which can be considered an electricity farm. The solar collection system 10 includes a solar collector array 11 which includes a plurality of solar collection modules 12. Each of the solar collection modules 12 can include a plurality of solar collecting devices 14 supported by a drive shaft or torque tube 16. Each of the torque tubes 16 are supported above the ground by a support assembly 18. Each of the support assemblies 18 can include a pile and a bearing assembly 20.

With continued reference to FIG. 1, the system 10 can also include a tracking drive 30 connected to the torque tube 16 and configured to pivot the torque tube 16 so as to cause the collector devices 14 to track the movement of the sun. In the illustrated embodiment, the torque tubes 16 are arranged generally horizontally and the modules 12 are connected to each other, as more fully described in U.S. patent application Ser. No. 13/176,276, filed Jul. 5, 2011, the entire contents of which is hereby expressly incorporated by reference. However, inventions disclosed herein can be used in the context of other types of arrangements. For example, the system 10 provide for controlled tilting about two axes, although not illustrated herein.

Additionally, the solar collection devices 14 can be in the form of photovoltaic panels, thermal solar collection devices, concentrated photovoltaic devices, or concentrated thermal solar collection devices. In the illustrated embodiment, the solar collection devices 14 are in the form of non-concentrated photovoltaic modules.

The solar collection system 10 can further include an electrical system (not shown) connected to the array 11. For example, such an electrical system can include the array 11 as a power source connected to a remote connection device with power lines. The electrical system can also include a utility power source, a meter, an electrical panel with a main disconnect, a junction, electrical loads, and/or an inverter with the utility power source monitor. The electrical system can be configured and operate in accordance with the descriptions set forth in U.S. Patent Publication No. 2010/0071744, the entire contents of which is hereby expressly incorporated by reference.

Figure 2:
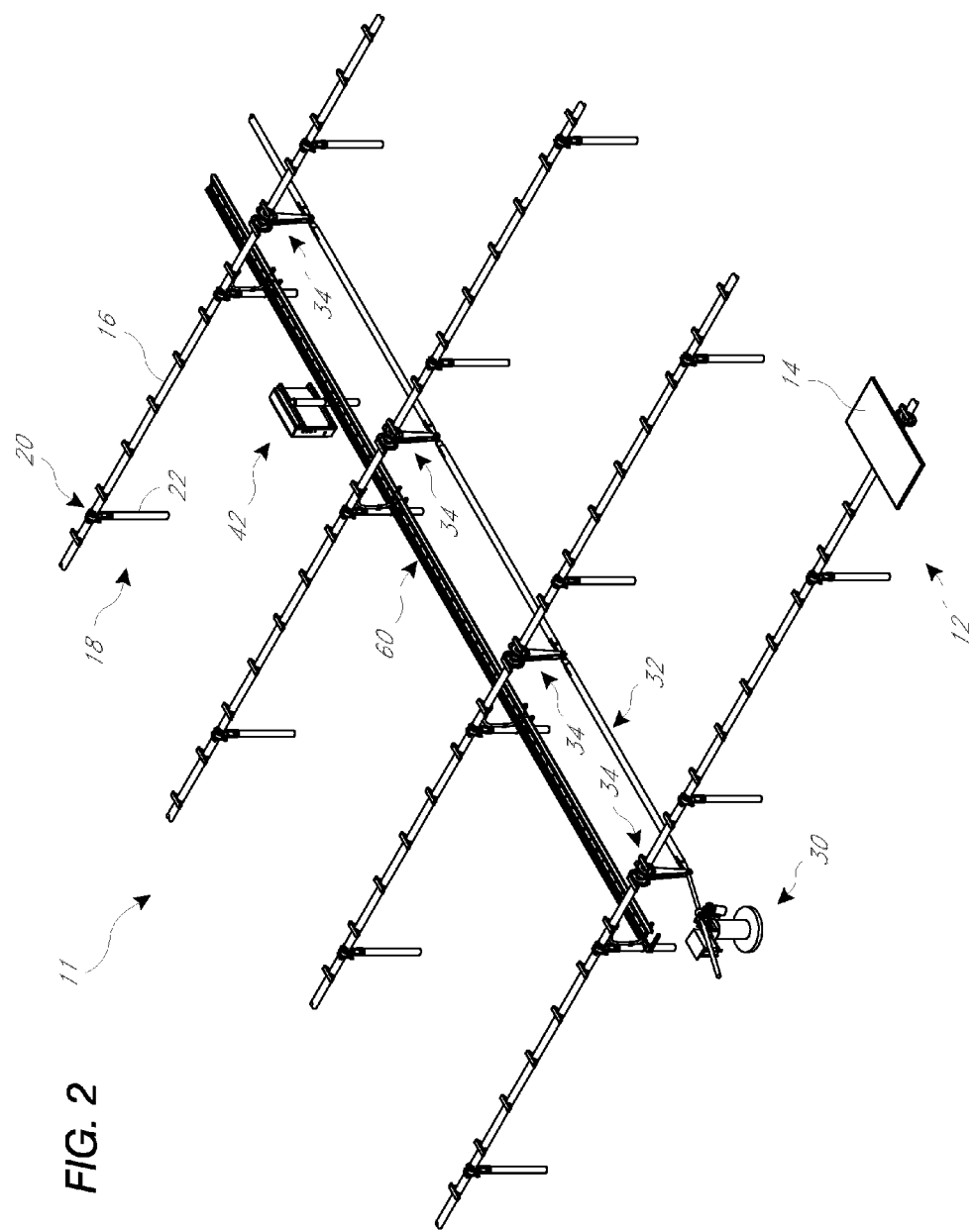
FIG. 2 is a perspective view of the solar collection system of FIG. 1, illustrating a plurality of piles mounted to the ground and supporting a plurality of torque tubes with a sun-tracking drive.

FIG. 2 illustrates the array 11 with all but one of the solar collection devices 14 removed. As illustrated, each of the support assemblies 18 includes the bearing 20 supported at the upper end of a pile 22. The torque tube 16 can be of any length and can be formed in one or more pieces. The spacing of the piles 22 relative to one another, can be determined based on the desired limits on deflection of the torque tubes 16 between the support structures 18, wind loads, and other factors.

The tilt drive 30 can include a drive strut 32 coupled with the torque tube 16 in a way that pivots the torque tube 16 as the drive strut 32 is moved axially along its length. The drive strut 32 can be connected with the torque tube 16 with torque arm assemblies 34. In the illustrated embodiment, the torque arm assemblies 34 disposed at an end of each of the torque tube 16. Additionally, the array 11 can include an electrical wire tray 60 supported by one or more of the piles 22, or by other means.

Figure 3:
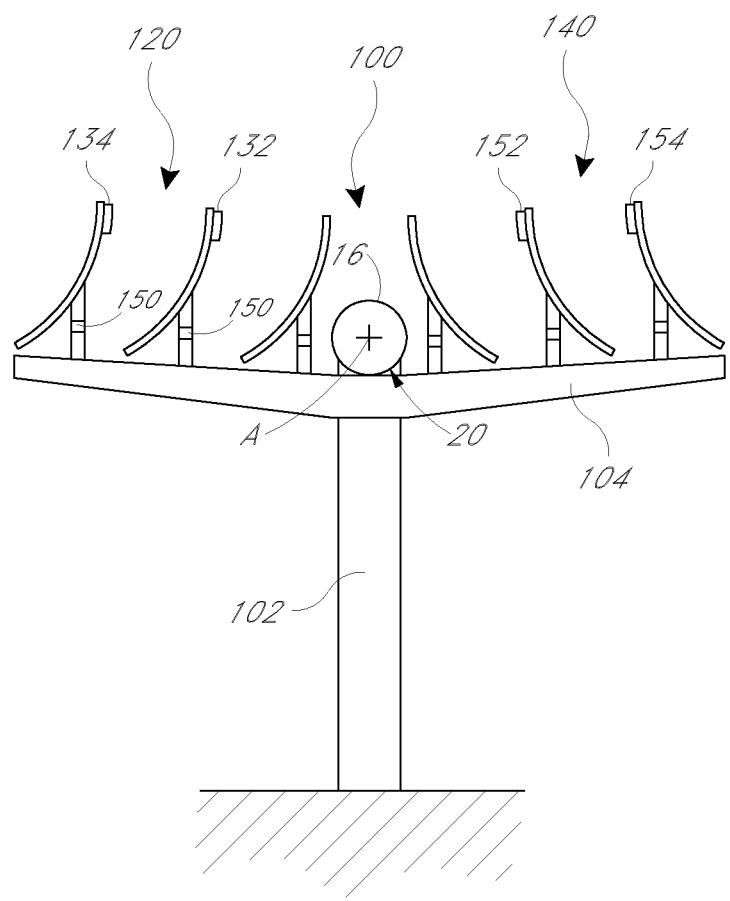
FIG. 3 is a schematic side elevational view of a concentrated photovoltaic assembly in which the sun-tracking drive can also be used.

The array 11 can also be in the form of a plurality of sun-tracking, concentrated photovoltaic assemblies. For example, as shown in FIG. 3, a concentrated photovoltaic solar assembly 100 can include a pile 102 which supports one or more cross beams 104 and a torque tube 106. The cross beam 104 in turn supports first and second groups of concentrating elements 120, 140, supported by the cross beam 104.

One group of concentrating elements 120 face in one direction and the second group of concentrating elements 140 are positioned so as to face the opposite direction, with the changeover between them occurring at the torque tube 106. The pier 102 can be a single post or one of several supporting the solar concentrator assembly 100.

Connectors 150 support the concentrator elements 120, 140 relative to the cross beam 104. Additionally, photovoltaic collectors 132, 134, 152, 154 can be mounted on the back sides of the concentrator elements 120, 140. In this configuration, each of the concentrator elements 120, 140 are configured to focus a band of concentrated light onto the photovoltaic units 132, 134, 152, 154. A sun-tracking drive system 200 (FIGS. 4 and 5) can drive the torque tube 16 to pivot about the pivot axis A. Further detail regarding the optional configuration of a concentrated photovoltaic environment of use is set forth in U.S. patent application Ser. No. 12/977,006 filed Dec. 22, 2010, the entire contents of which is hereby incorporated by reference.

Figure 5:
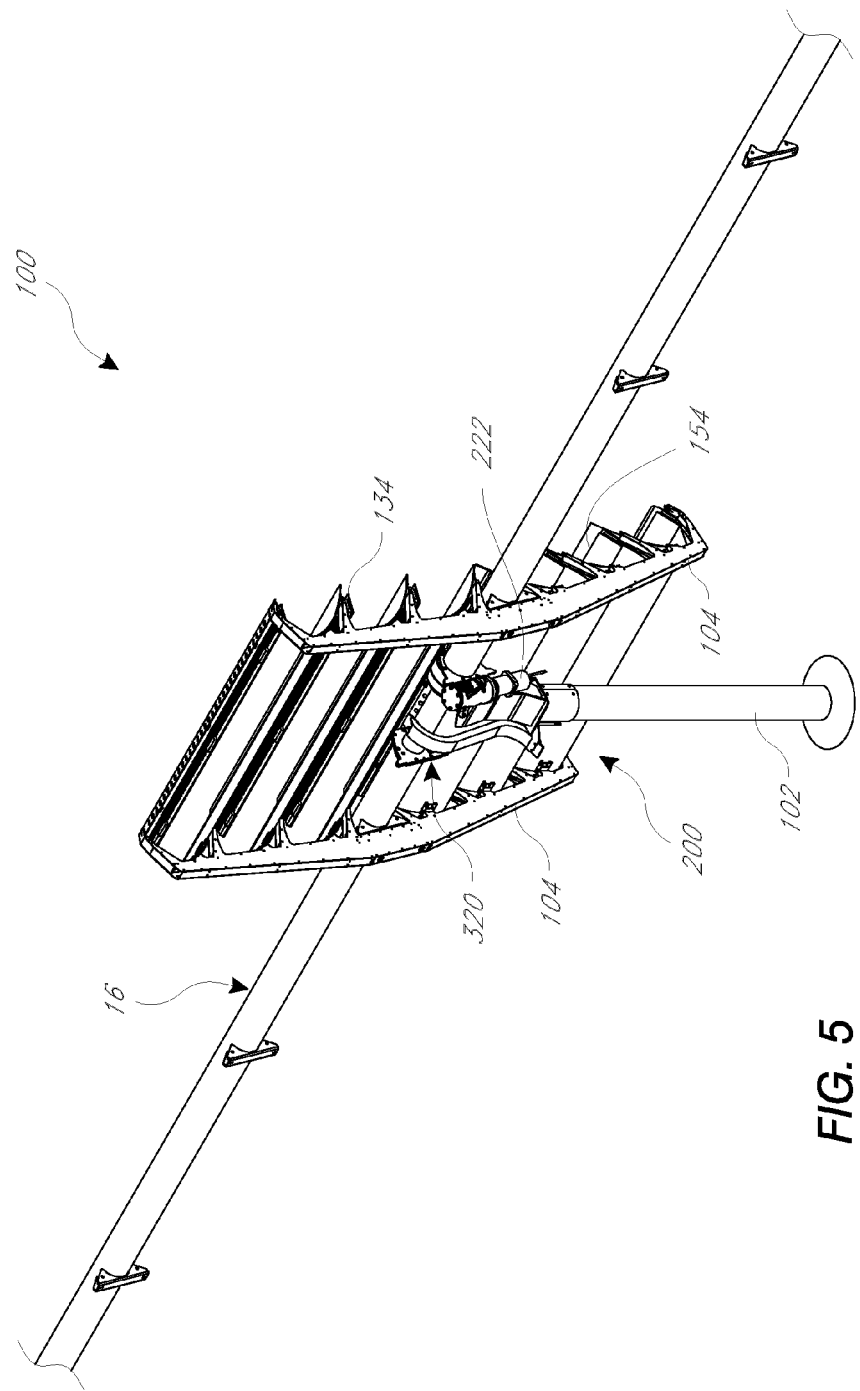
FIG. 5 is a perspective view of a sun-tracker drive of the concentrated photovoltaic assembly of FIG. 3.

FIG. 5 is a perspective view of the photovoltaic collector assembly with an optional sun-tracker drive 200. All of the descriptions noted above with respect to the environment of use and connectivity of the drive 30 also applies to the descriptions set forth below of the sun-tracker drive 200. The position of the photovoltaic collector assembly 100 illustrated in FIG. 5 is a position that can be used more conveniently for accessing and servicing the sun-tracker drive 200, but is not a position generally used during generation of electricity.

Figure 4:
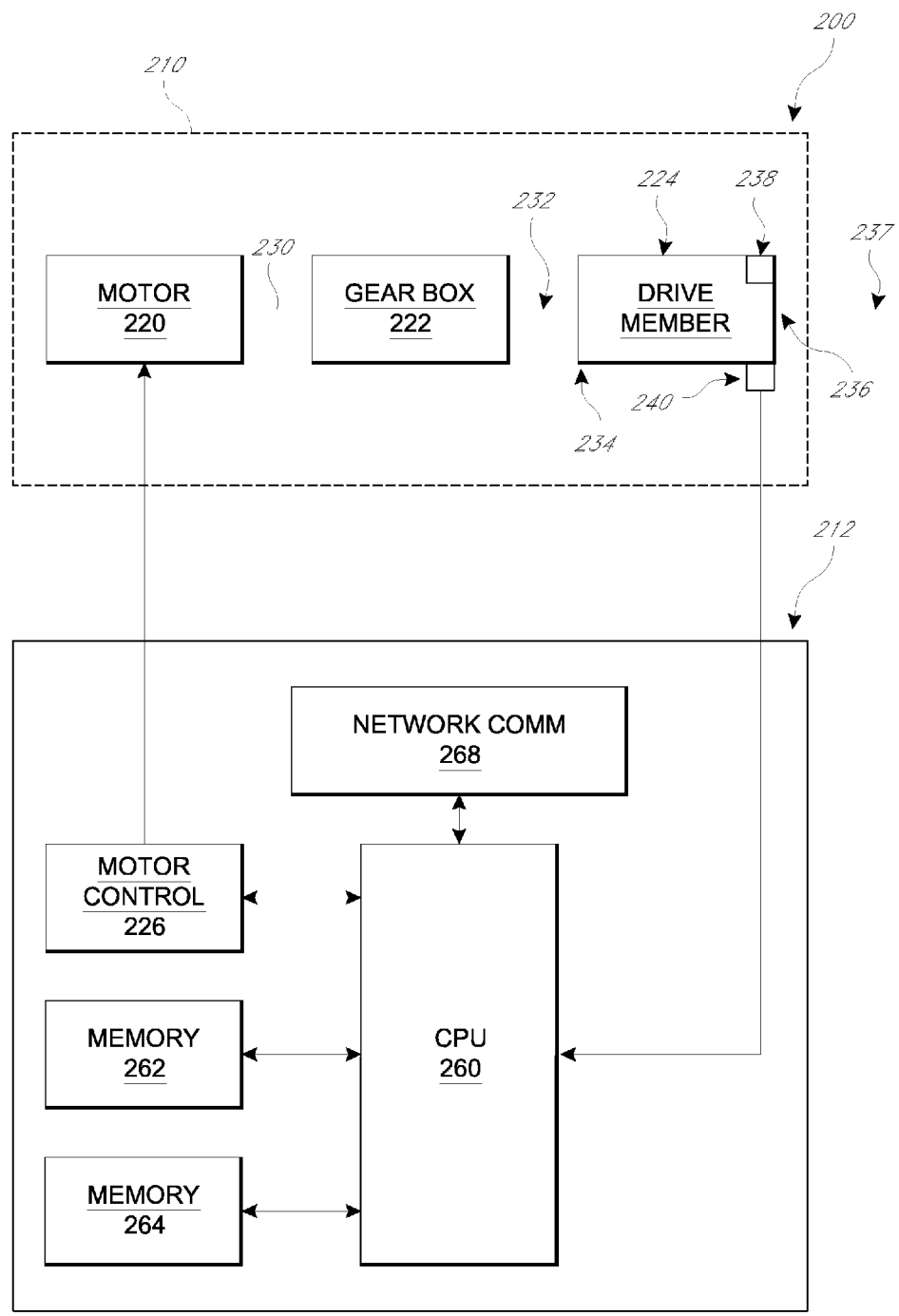
FIG. 4 is a schematic diagram of a controller that can be used with the sun-tracker drive of FIG. 6.

With reference to FIG. 4, the sun-tracking drive 200 can include a drive assembly 210 and a drive controller 212. As shown in FIG. 4, the drive assembly can include a motor 220, a gearbox 222 and a drive member 224.

The motor 220 can be any type of drive motor including, for example, but without limitation, a DC motor, an AC motor, a servo motor, shunt motor, induction motor, stepper motor, etc. Other electric motors can also be used.

An output shaft 230 of the motor can be connected to an input of the gearbox 222. The gearbox can be any type of gearbox, and be configured to provide any desired output gear ratio. In the illustrated embodiment, the gear reduction ratio of the gearbox 222 is about 36000:1. In some embodiments, as described below, the gearbox 222 is configured such that its output shaft 232 is at a 90° angle relative to the output shaft 230. This type of motor and gearbox combination is commercially available and typically referred to as a "worm drive".

The sun-tracker drive 200 can also include a lower portion 300 configured to provide a secure mount to a pile, such as the piles 102, illustrated in FIGS. 1-6. In the illustrated embodiment, the lower portion 300 includes a clamp portion 302 for adjusting the tightness of the connection between the lower portion 300 and the pile 102.

Optionally, the drive 200 can include an hourglass-shaped intermediate portion 304 extending from the lower portion 300 to a support portion 306. The intermediate portion 304, in the illustrated embodiment, is made from a plurality of metal plates, welded together. However, other configurations can also be used.

The upper portion 306 is configured to provide a stable mount for the hardware of the drive 200. A mounting plate 308 can be used to connect the upper portion 306 to a mounting face 310 of the gearbox 222. The input end 234 (FIG. 4) of the drive member 224 is connected to an output shaft 232 of the gearbox 222. Optionally, in some embodiments, an additional drive member (not illustrated) can be mounted to the opposite side of the gearbox 222.

Figure 6:
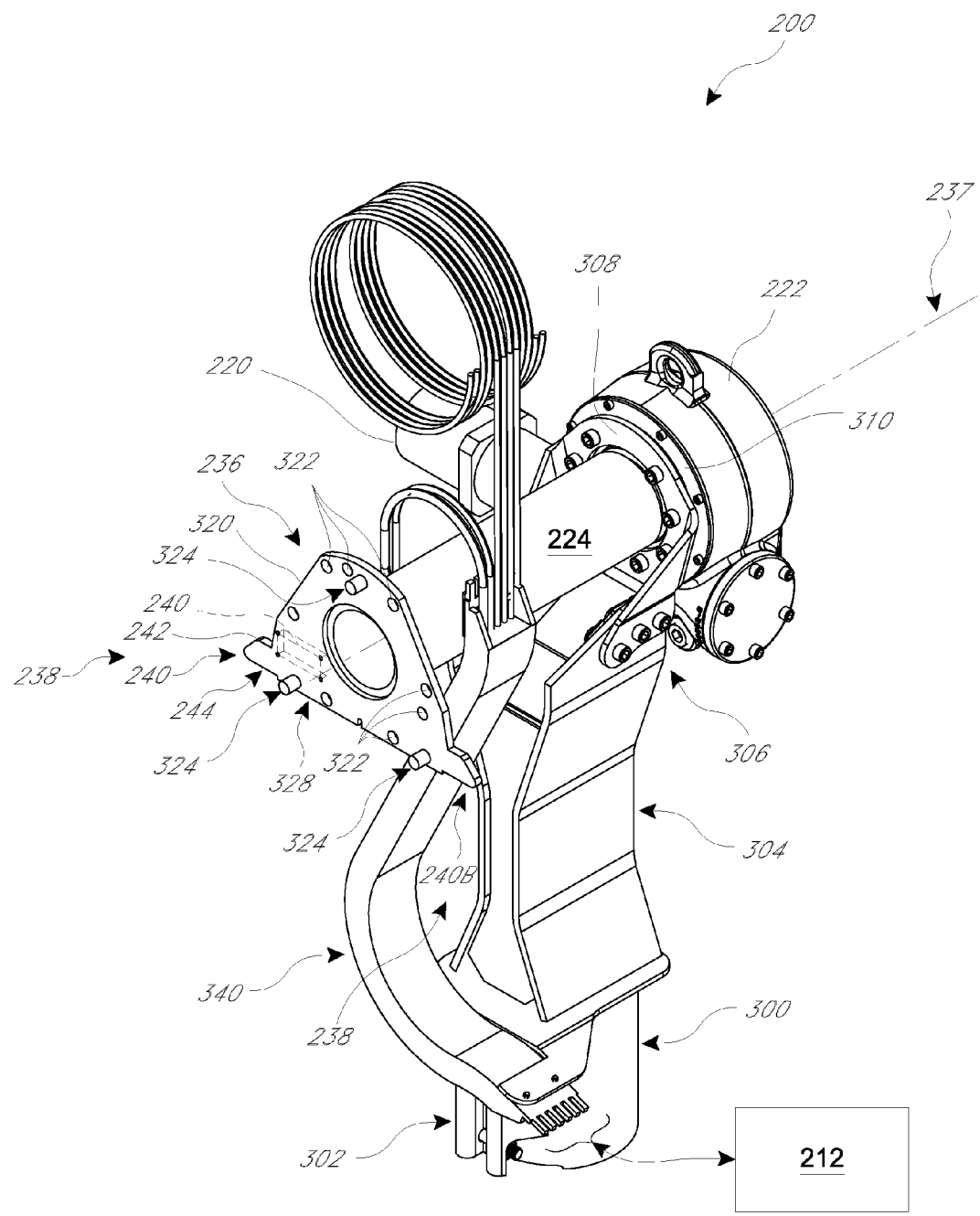
FIG. 6 is an enlarged perspective view of the sun-tracker drive and mounting hardware illustrated in FIG. 5.

The drive member 224 can include a drive plate 320 (FIG. 5) securely mounted to the output end 236 of the drive member 224. The drive plate 320 (FIG. 5) includes one or more apertures 322 for receiving fasteners for providing a secure connection to a torque tube, such as the torque tube 16 (FIGS. 4 and 6). Optionally, the plate 320 can also include one or more optional alignment pins 324. Such alignment pins can be shaped and arranged to provide a high-precision connection to the torque tube 16. For example, but without limitation, the pins 324 and corresponding recesses formed on a mating drive plate on a torque tube 16, can be configured to maintain an alignment between the drive member 224 and the torque tube to a tolerance of ½ a degree, ¹⁄₁₀th of a degree, ⁵⁄₁₀₀ths of a degree or less.

Additionally, in some embodiments, the reference portion 238 can be formed on a lower surface of the drive plate 320 (FIG. 5). As noted above, in some embodiments, the reference portion 238 can be machined flat and oriented such that the reference portion 238 is horizontal relative to gravity when a corresponding collector assembly is in a horizontal or "noon" orientation. This position, as noted above, also corresponds to a reference position of the solar collector assembly 100. Thus, when the reference position 238 is horizontal relative to gravity, then the connected corresponding solar collector assembly 100 is also at the same reference position, e.g., 0° or "stowed." Additionally, as illustrated in FIG. 6, the inclinometer 240 can be mounted to the drive plate 320.

The illustrated embodiment of FIG. 6 also includes an optional wire loom 340 which is configured to protect the various wires extending between the controller 212 and the drive hardware 210. Other connections and wire looms can also be used.

The controller 212 can be configured to provide appropriate control over the motor 220 for any purpose. In the illustrated embodiment, the controller 212 is configured to provide feedback control over the motor 220 such that the drive member 224 is driven to and maintained at a desired target orientation, such as a desired inclination. The controller 212 can perform such a feedback control function with any arrangement of sensors. In the illustrated embodiment, the controller 212 uses an output from the inclinometer 240 to control operation of the motor 220.

In some embodiments, the controller 212 can include a central processing unit (CPU) 260, one or more memory devices 262, 264, and a motor controller module 266. Optionally, the controller 212 can include a network communication device 268.

The motor controller 266 can be configured to receive signals from the CPU 260 and to control the delivery of electrical power to the motor 220, to thereby control the direction and speed of the output shaft 230 of the motor 220. Such motor controllers are well known in the art, and thus the internal components of the motor controller 266 are not described further.

Figure 7:
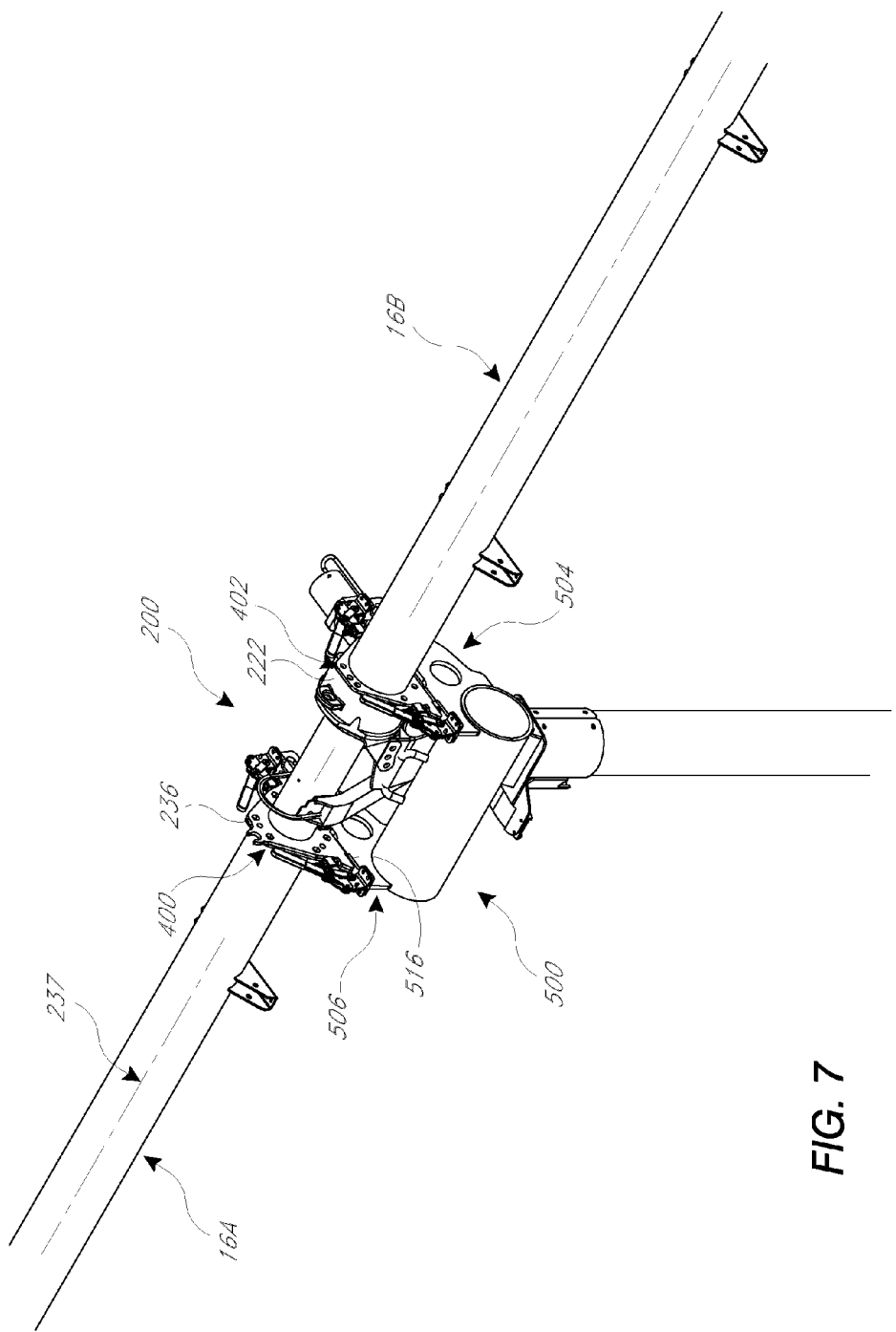
FIG. 7 is a perspective view of the sun-tracker drive of FIG. 6 with an alignment tool engaged therewith and for aligning two torque tubes engaged with the sun-tracker drive.

With continued reference to FIGS. 6 and 7, in some embodiments, the reference portion 238 can be of any shape or orientation. In some embodiments, the reference portion 238 is configured to provide a conveniently accessible surface that can be used to engage instrumentation for purposes, such as, but without limitation, verify an orientation of the drive member 224 with high precision.

For example, the reference portion 238 can be in the form of protrusions from the drive plate 320 of the drive member 224. For example, the reference portion 238 can comprise a protrusion 240 that extends radially or offset from a radial direction, and outwardly from the drive number 224, relative to the axis 237. In the illustrated embodiment, the protrusion 240 is offset from a radial direction. The drive plate 320 can also include a protrusion 240B on an opposite side of the drive plate 320. For convenience, only the protrusion 240 is described in greater detail below with the understanding that the protrusion 240B can be identical or similar to the protrusion 240. The protrusion 240B can be, optionally, mounted a greater distance away from the surface to 224 to decrease the effects of local imperfections of the surface 244, the drive member 224, and/or the plate 320.

In some embodiments, the protrusion 240 includes parallel and oppositely facing reference surfaces 242, 244. The reference surfaces 242, 244 can be precision machined so as to provide a high precision reference surface for aiding and alignment purposes, described in greater detail below.

With reference to FIG. 7, in some embodiments, torque tubes can be disposed on either side of the sun-tracker drive 200. For example, a first torque tube is identified by the reference numeral 16A and a second torque tube is identified with the reference numeral 16B. Each of these torque tube 16A, 16B include drive plates 400, 402. The drive plate 400 is configured to engage with the drive plate 320. The drive plate 402 is configured to engage with a drive plate on the gear box 222.

In order to provide more convenient and accessible means for aligning the torque tube 16A, 16B, both of the drive plates 400, 402 include identically positioned reference portions 238. In some embodiments, all of the torque tubes in a corresponding solar power farm include drive plates that have an essentially identical configuration, and in particular, the location and arrangement of the reference surfaces 242, 244 of the reference portion 238.

With reference to FIG. 7, an alignment tool 500 can be engaged with the reference portions 238 of the torque tube 16A, 16B. The alignment tool is configured to hold the reference portions 238 of torque tube 16A in alignment with the reference portions 238 of the torque tube 16B. In some embodiments, the alignment tool 500 is configured to maintain a rotational alignment between the reference portions 238 of the torque tube 16A, 16B to a tolerance of at least about 0.02 degrees of rotation. Further, in some embodiments, the alignment tool 500 can be configured to maintain the alignment accuracy of at least about 0.02 degrees of rotation when one torque tube, such as the torque tube A is under a load of about 700 foot pounds of torque relative to the torque tube 16B.

Figure 8:
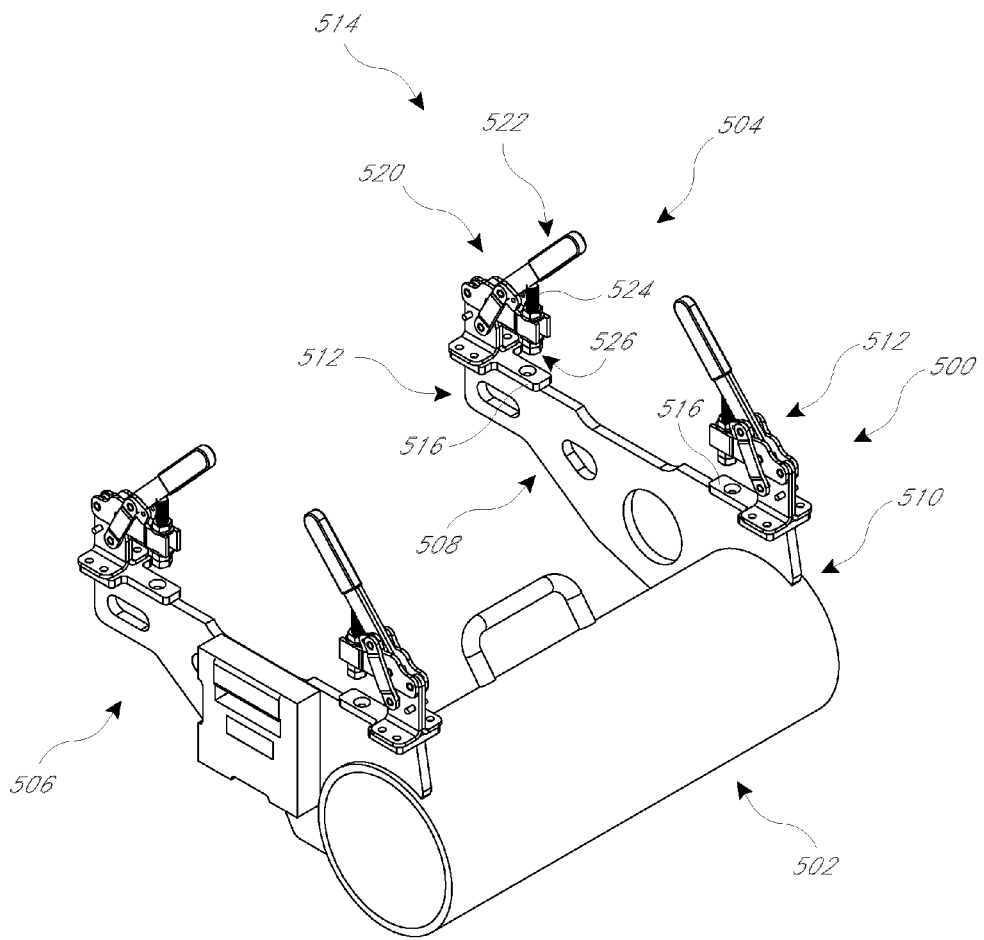
FIG. 8 is a perspective view of the alignment tool removed from the sun-tracker drive.

FIG. 8 illustrates, in greater detail, an optional configuration for the alignment tool 500. The alignment tool 500 can include a rigid body member 502 and first and second engagement arm assemblies 504, 506.

The alignment tool body 502 can comprise any structurally rigid member. In the illustrated embodiment, the member 502 is formed from a pipe having a diameter of about eight inches which may be larger, smaller or roughly equal to a diameter of the torque tube 16A, 16B. The wall thickness of the pipe forming the rigid body member 502 can be approximately equal to the same wall thickness as the torque tube 16A, 16B, or it can be thicker, and optionally can be made of aluminum or other materials. The wall thickness and overall diameter of the rigid body member 502 is sized so as to provide the desired rigidity. As noted above, in some embodiments, the alignment tool can be made sufficiently stiff so as to withstand 700 foot pounds of torque while maintaining a rotational alignment between its ends of about 0.02 degrees of rotation. However, other configurations can also be used such as any cross-sectional shape or wall thickness or to provide the desired rigidity.

The first and second arm assemblies 504, 506 can have essentially an identical configuration and structure. Thus, only the arm assembly 504 is described in detail below, it being understood that the arm assembly 506 can have the identical or similar structure.

In some embodiments, the first arm 504 can include an arm member 508 having a base end 510 connected to a first end of the body 502 and extending generally perpendicularly to the body 502 toward a second end 512. The arm member 508 can be configured to be highly rigid. In some embodiments, the arm member 508 is made from metal material having about the same thickness as the wall thickness of the body 502. However, other configurations can also be used.

The arm 504 can also include two clamp mechanisms 512, 514 disposed of the first and second ends 510, 512 respectively. The clamp assemblies 512 can have essentially an identical configuration (although arranged in a mirror-imaged orientation) and thus only the clamp assembly 514 will be specifically described herein.

The clamp assembly 514 can include a reference surface 516 that is sized and machined to lie precisely against the reference surface 244 (FIG. 6) of the output end 236 and/or of the drive plates 320, 400, 402 (FIG. 7). More specifically, the reference surface 516 of the first and second clamp assemblies 512, 514 are both positioned and machined so as to lie securely and in a tight fitting abutment with the references surfaces 244 of each of the drive plates 320, 400, 402.

Additionally the clamping device 514 can include a releasable clamping mechanism 520. In some embodiments, the releasable clamping mechanism 520 includes a lever 522 configured to press against a pressing member 524 so as to clamp the protrusions 238 of the drive plates 320, 400, 402. In some embodiments, the pressing member 524 includes a pressing face 526 configured and oriented to press securely against the reference surface 242 of the drive plates 320, 400, 402.

In some embodiments, the clamping mechanism 520 can be configured to operable without any tools. For example, in the illustrated embodiment, the clamping mechanism includes pivoting members configured to provide an "over center" mode of operation of the clamping mechanism 520. This type of mechanism is well known and commercially available in a variety of sizes and thus is not described in greater detail herein.

Optionally, the clamping mechanism 520 can be configured to be adjustable. For example, the pressing member 524 can be in the form of bolts and a plurality of nuts so as to change the effective positioning of the pressing face 526. As such, the clamping mechanism 520 can be adjusted to maintain the desired pressing force when in use. In some embodiments, the clamping mechanism 520 can be configured to provide about 500 newtons of clamping force, or more.

The longitudinal spacing of the arms 504, 506 can be adjusted to provide the desired alignment performance. For example, with reference to FIG. 7, the arm 504 is connected to the drive plate 402 of the torque tube 16B. However, the arm 506 is positioned so as to simultaneously engage both the protrusions 238 of the drive plate 320 and 400. Thus, the reference surface 516 of the arm assembly 506 and the face 526 can be provided with a width that is approximately equal to twice the width of the reference surface 242. As such, reference surface 516 and the pressing face 526 can engage both the reference portions 238 of both the drive plates 320, 400 to thereby align both the drive plate 320, 400 with the drive plate 402.

During use, and in particular during construction and/or realignment of the components of solar farm, the torque tube 16A, 16B can be connected to the drive plate 320 and the gear motor 222 with bolts. During an alignment procedure, such bolts can be left loosened so as to allow the torque tube 16A, 16B to rotate slightly relative to one another. Then, the alignment tool 500 can be engaged with the drive plates 320, 400, 402. Specifically, all of the clamping mechanisms 520 can be moved from the open to engaged states, as illustrated in FIGS. 7 and 8. With all the clamping mechanisms 520 in their engaged states, the reference surfaces 244 would be pressed against the reference surfaces 516 by the pressing faces 526 of the clamping mechanisms 520. Thus, the reference surfaces of the drive plates 320, 400, and 402 would all be aligned with each other.

As noted above, in some embodiments, the alignment tool 500 can be provided with sufficient strength to maintain a rotational alignment of the torque tube 16A, 16B to a precision of about at least 0.02 degrees of rotation even when subjected to a torque of about 700 foot pounds. Although torques of such magnitude are unlikely to be generated in the field, it is possible that winds, such as gusts of wind, can generate large torques on the torque tube 16A, 16B during an alignment procedure. Additionally, large torque can be generated by the force of tightening the bolts, or bolt holes that are obscured by zinc or other materials that may obstruct the bolt holes and that may be deposited during a galvanization process. Thus, constructing the alignment tool 500 with a high torsional rigidity can be beneficial.

With the alignment tool 500 engaged as noted above, all of the bolts between the drive plate 400, the output end 236, the gear motor 222 and the drive plate 402 can be tightened to the specified torques. The alignment tool 500 can then be removed by simply pulling the levers 522 in the appropriate direction.

Although not illustrated in FIG. 7, the solar modules themselves can provide some hindrance to alignment procedures. Thus, by constructing the alignment tool 500 such that it can wrap around or "straddle" the sun-tracking drive 200 while slung generally below the rotational axis 237, alignment procedures can be performed during initial construction of a solar farm as well as after construction is complete.

Additional advantages can be achieved where the reference portions 238, such as the reference surfaces 242, 244 are parallel, and equal in profile and orientation, to all of the other alignment surfaces 242, 244 on the torque tubes 16 which are serially connected to each other. As such, some or all of the alignment surfaces can be measured for angle with respect to gravity during manufacturing without large tools that are referenced to a fixed reference plane. The only check tool needed when measuring the reference surfaces is an inclinometer.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for aligning two shafts, each shaft having at least one alignment reference surface, the method comprising:
   pressing the alignment reference surface of a first shaft against a first reference surface of an alignment device;
   pressing the alignment reference surface of a second shaft against a second reference surface of the alignment device wherein the first and second reference surfaces of the alignment device are spaced apart along the longitudinal direction of the shafts; and
   rotationally fixing the first shaft to the second shaft while the alignment device is pressed against the reference surfaces of the first and second shafts.

2. The method according to claim 1 additionally comprising positioning an intervening connection member between a connection member of the first shaft and a connection member of the second shaft, wherein the step of rotationally fixing comprises fixing the connection member of the first shaft, the connection member of the second shaft and the intervening connection member to each other while the alignment device is pressed against the reference surfaces of the first and second shafts.

3. The method according to claim 2, wherein the step of positioning an intervening connection member comprises positioning the first and second shafts on opposite sides of a drive mechanism configured to drive the first and second shafts through a range of pivotal motion about the longitudinal axes of the first and second shafts.

4. The method according to claim 2 additionally comprising supporting the intervening connection member with a bearing such that the intervening connection member can rotate about a longitudinal axis of the shafts.

5. The method according to claim 1 additionally comprising removing the alignment device from the reference surfaces of the first and second shafts.

6. The method according to claim 1, wherein the step of pressing the reference surface of a second shaft comprises using an alignment tool that is sufficiently stiff to maintain the position of the first and second reference surfaces to within about 0.02 degrees of rotation about the longitudinal axes of the shafts when the first shaft is subject to a torque of about 700 foot-pounds relative to the second shaft.

7. The method according to claim 1, wherein the step of pressing the reference surface of a first shaft comprises clamping the reference surface of the first shaft to the first reference surface with a clamp mechanism that is integrated with the alignment device and is configured to move between engaged and disengaged states without any additional tools.

8. The method according to claim 1, wherein the step of pressing the reference surface of a first shaft comprises clamping the reference surface of the first shaft to the first reference surface with a clamp mechanism having an over-center linkage configuration.

9. The method according to claim 1, wherein the step of pressing the reference surface of the first shaft comprises pressing the reference surface of the first shaft against the first reference surface with a force of at least about 500 newtons.

10. The method according to claim 1, wherein the step of pressing comprises pressing a second reference surface of the first shaft against a third reference surface of the alignment device, the first and third reference surfaces of the alignment device being disposed on opposite sides of the first shaft, and pressing a second reference surface of the second shaft against a fourth reference surface of the alignment device, the second and fourth reference surfaces of the alignment device being disposed on opposite sides of the second shaft.

11. The method according to claim 1, wherein the step of rotationally fixing comprises tightening a plurality of bolts through mating flanges on the first and second shafts.

12. A method for connecting a first drive member of a first shaft to a second drive member of a second shaft, wherein the first and second shafts are approximately aligned along a longitudinal axis and wherein the first and second drive members are spaced from each other along a longitudinal axis of the shafts, comprising:
- a first step for securing a first portion of an alignment member to a first alignment reference portion of the first shaft;
- a second step for securing a second portion of the alignment member to a second alignment reference portion of the second shaft, wherein the first and second alignment reference portions are spaced apart from each other along the longitudinal axes of the first and second shafts; and
- rotationally fixing the first drive member relative to the second drive member while the alignment member is secured to the first and second alignment reference portions.

13. An alignment device for aligning shafts along a longitudinal axis of the shafts, comprising:
- a bridge member having a first end and a second end;
- a first reference surface disposed at the first end and a second reference surface disposed at the second end;
- a first engagement device disposed at the first end and configured to engage the first shaft having a first shaft reference surface and to press the first shaft reference surface against the first reference surface; and
- a second engagement device configured to engage a second shaft and to press a second shaft reference surface against the second reference surface, to thereby align first and second shafts with each other, the first and second engagement devices being spaced apart from each other along the longitudinal axes of the shafts.

14. The alignment device according to claim 1, wherein the first engagement device comprises a clamp.

15. The alignment device according to claim 1, wherein the bridge member comprises a rigid body having an outer diameter at least about 75% of a diameter of the first shaft.

16. The alignment device according to claim 1 additionally comprising a first engagement device mount and a second engagement device mount fixing the first and second engagement devices to the first and second ends of the bridge member, respectively.

17. The alignment device according to claim 16, wherein the first and second engagement device mounts are sized so as to hold the bridge member offset and parallel to shafts that the first and second engagement devices can engage, such that an outer surface of the bridge member is spaced at a distance from the longitudinal axis of the shafts at least as large as a radius of the largest of the first and second shafts.

18. The alignment device according to claim 1, wherein the bridge member is sufficiently stiff to maintain the position of the first and second reference surfaces to within about 0.02 degrees of rotation about the longitudinal axes of the shafts when the first shaft is subject to a torque of about 700 foot-pounds relative to the second shaft.

19. The alignment device according to claim 1, wherein the first engagement device comprises a clamp having a handle and configured to move between a disengaged state and an engaged state without any additional tools.

20. The alignment device according to claim 19, wherein the clamp comprises a jaw member and the handle is connected to the jaw member with an over-center linkage.

* * * * *